(12) United States Patent
Kawakami et al.

(10) Patent No.: US 8,414,279 B2
(45) Date of Patent: Apr. 9, 2013

(54) IMPRINT APPARATUS AND ARTICLE MANUFACTURING METHOD

(75) Inventors: Eigo Kawakami, Utsunomiya (JP); Kazuyuki Kasumi, Utsunomiya (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 349 days.

(21) Appl. No.: 12/562,052

(22) Filed: Sep. 17, 2009

(65) Prior Publication Data

US 2010/0072649 A1    Mar. 25, 2010

(30) Foreign Application Priority Data

Sep. 19, 2008   (JP) ................................ 2008-241840

(51) Int. Cl.
*B29C 43/22*   (2006.01)
*B29B 17/00*   (2006.01)

(52) U.S. Cl. ........... 425/150; 264/40.7; 264/69; 264/70; 264/71; 264/293; 425/432; 977/887

(58) Field of Classification Search ................. 264/40.7, 264/69, 70, 71, 293; 425/150, 432; 977/887
See application file for complete search history.

(56) References Cited

U.S. PATENT DOCUMENTS

| | | | |
|---|---|---|---|
| 2003/0142313 A1* | 7/2003 | Katayama | 356/399 |
| 2004/0021866 A1* | 2/2004 | Watts et al. | 356/401 |
| 2007/0210460 A1* | 9/2007 | Thallner | 257/797 |
| 2010/0072649 A1* | 3/2010 | Kawakami et al. | 264/40.7 |
| 2010/0072664 A1* | 3/2010 | Kawakami et al. | 264/293 |
| 2010/0078840 A1* | 4/2010 | Kawakami et al. | 264/40.1 |

FOREIGN PATENT DOCUMENTS

| | | | |
|---|---|---|---|
| JP | 2004-288811 A | | 10/2004 |
| JP | 2005-116978 A | | 4/2005 |
| JP | 2006-19464 | | 1/2006 |
| JP | 2006-019464 A | | 1/2006 |
| JP | 2007-266053 | * | 10/2007 |
| JP | 2007-266053 A | | 10/2007 |
| JP | 2007266053 | * | 10/2007 |
| JP | 2007-329367 A | | 12/2007 |
| JP | 2008-006704 | | 1/2008 |

OTHER PUBLICATIONS

M. Colburn et al., "Step and Flash Imprint Lithography: A New Approach to High-Resolution Patterning," Proceedings of the SPIE's 24th International Symposium on Microlithography: Emerging Lithographic Technologies III, Santa Clara, CA, vol. 3676, Part One, pp. 379-389, Mar. 1999.

* cited by examiner

*Primary Examiner* — Yogendra Gupta
*Assistant Examiner* — Jeremiah Smith
(74) *Attorney, Agent, or Firm* — Canon USA Inc IP Division

(57) ABSTRACT

An imprint apparatus molds resin dispensed on a shot region of a substrate with a mold and forms a pattern of resin on the shot region. The apparatus includes a mold stage configured to hold the mold, a substrate stage configured to hold the substrate, a drive mechanism configured to change a relative positional relationship between the mold stage and the substrate stage in an X-Y plane that defines a coordinate of the shot region and a Z-axis direction perpendicular to the X-Y plane, and a controller. The controller is configured to control the drive mechanism so that the mold and the shot region perform relative vibration, in the X-Y plane, with respect to a relative position where the mold and the shot region align, and a distance between the mold and the shot region decreases in the Z-axis direction in parallel with the vibration, and the resin is molded by the mold.

6 Claims, 14 Drawing Sheets

IMPRINT APPARATUS AND ARTICLE MANUFACTURING METHOD

BACKGROUND OF THE INVENTION

1. Field of the Invention

The present invention relates to an imprint apparatus that molds resin dispensed on a shot region of a substrate and forms a pattern of resin on the shot region.

2. Description of the Related Art

Nanoimprinting is already known as an alternative to a method of forming a fine pattern on a semiconductor device using UV photolithography, X-ray lithography, or electron beam lithography. Nanoimprinting is a technique in which a mold on which a fine pattern is formed, for example, by electron beam exposure, is pressed against a substrate such as a wafer to which a resin material (resist) is applied, and thereby the pattern is transferred onto the resist.

There are some types of nanoimprinting. A light cure method is one of them (M. Colburn et al., "Step and Flash Imprint Lithography: A New Approach to High-Resolution Patterning," Proceedings of the SPIE's 24th International Symposium on Microlithography: Emerging Lithographic Technologies III, Santa Clara, Calif., Vol. 3676, Part One, pp. 379-389, March 1999). The light cure method is a method in which an ultraviolet curing resin (resist) is exposed and cured with a transparent mold pressed against the resin, and then the mold is removed. Nanoimprinting by this light cure method is suitable for the manufacturing of semiconductor integrated circuits because temperature can be controlled with relative ease, and alignment marks on a substrate can be observed through the transparent mold.

Considering the superposition of different patterns, a step and repeat method is desirably applied in which a molds is tailored to the size of chips to be manufactured, and a pattern is sequentially transferred to shots on a substrate. In the case of pattern transfer by such a step and repeat method, if one transfer operation (to each shot) including pressing of a mold, exposing of light cure resin to light, and removal of the mold requires time, pattern transfer to the whole surface of a wafer (to all shots) also requires time, and this decreases the throughput of the pattern transfer apparatus.

To solve this problem, Japanese Patent Laid-Open No. 2008-006704 discloses a method in which throughput is enhanced by performing part of the operation of pressing or removing a mold in parallel with the step movement of a substrate. Japanese Patent Laid-Open No. 2007-266053 discloses a method in which a mold and a substrate are relatively moved in a direction parallel to the pattern surface of the mold to facilitate the spread of resin during the pressing of a mold, and thereby pressing time is reduced. Japanese Patent Laid-Open No. 2006-19464 discloses a method in which the removal of a mold is facilitated in a similar way.

Considering application to semiconductor devices, a pattern transfer apparatus using nanoimprinting is required to have not only a throughput enhanced by reducing resin spreading time during the pressing of a mold, but also a high superposition accuracy. The method disclosed in Japanese Patent Laid-Open No. 2007-266053, in which a mold and a substrate are relatively moved by a vibration generating mechanism, has a problem where the relative positions of the mold and the substrate are prone to be unfixed after the vibration generating mechanism is stopped. If alignment of the mold and the substrate is performed before the pressing of the mold, realignment is necessary.

The alignment after the pressing of the mold is not easy because a load is applied to the mold and the substrate. The time required for realignment reduces throughput. Although alignment is not mentioned in Japanese Patent Laid-Open No. 2006-19464, the method disclosed therein has the same problem because a substrate and a mold are relatively moved after the pressing of the mold.

SUMMARY OF THE INVENTION

The present invention provides an imprint apparatus that is advantageous in terms of throughput.

In an aspect of the present invention, an imprint apparatus that molds resin dispensed on a shot region of a substrate with a mold and forms a pattern of resin on the shot region. The apparatus includes a mold stage configured to hold the mold, a substrate stage configured to hold the substrate, a drive mechanism configured to change a relative positional relationship between the mold stage and the substrate stage in an X-Y plane that defines a coordinate of the shot region and a Z-axis direction perpendicular to the X-Y plane, and a controller. The controller is configured to control the drive mechanism so that the mold and the shot region perform relative vibration, in the X-Y plane, with respect to a relative position where the mold and the shot region align, and a distance between the mold and the shot region decreases in the Z-axis direction in parallel with the vibration, and the resin is molded by the mold.

Further features of the present invention will become apparent from the following description of exemplary embodiments with reference to the attached drawings.

DESCRIPTION OF THE EMBODIMENTS

Figure 1:
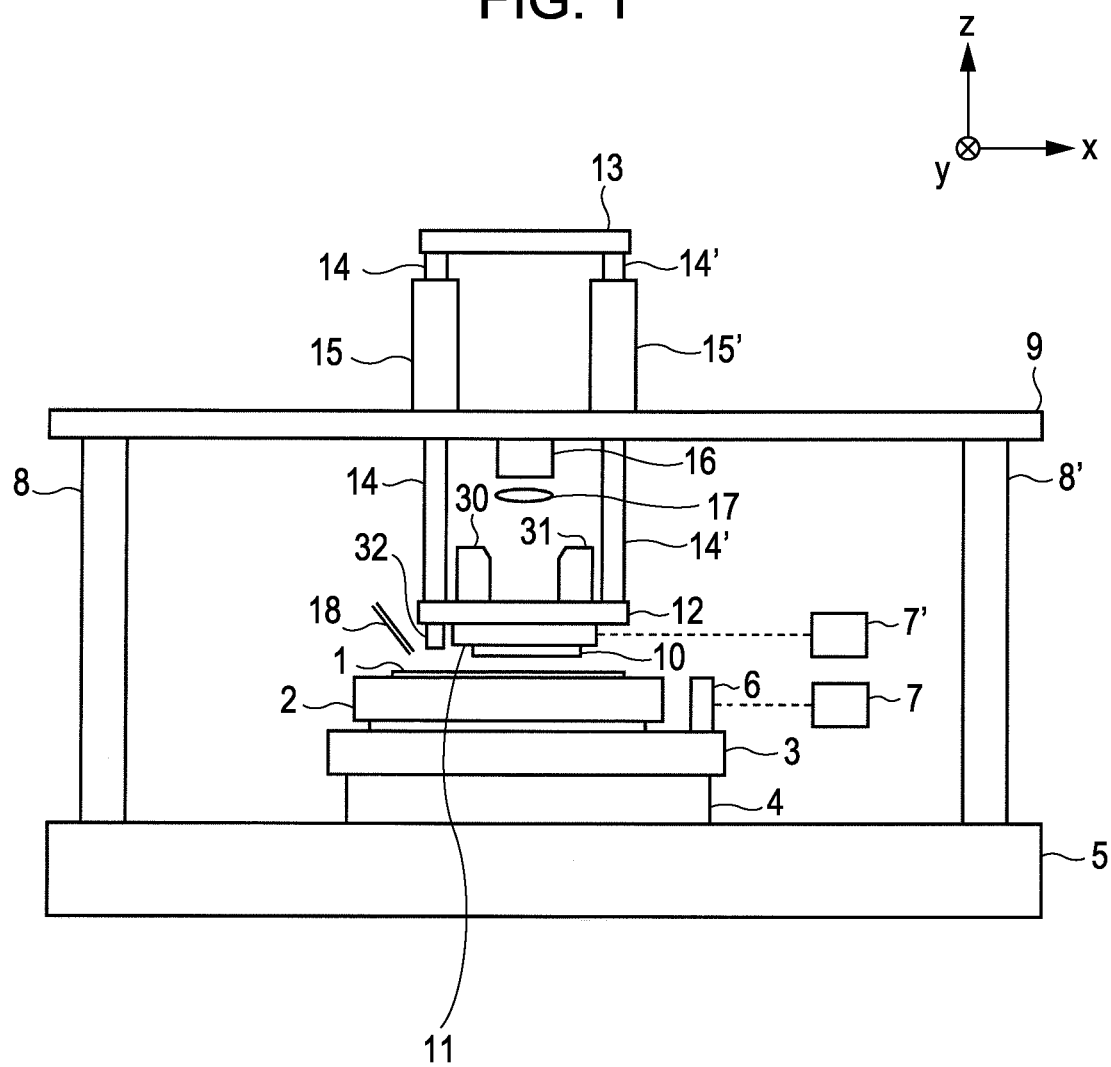
FIG. 1 shows an example configuration of an imprint apparatus.
Figure 2:
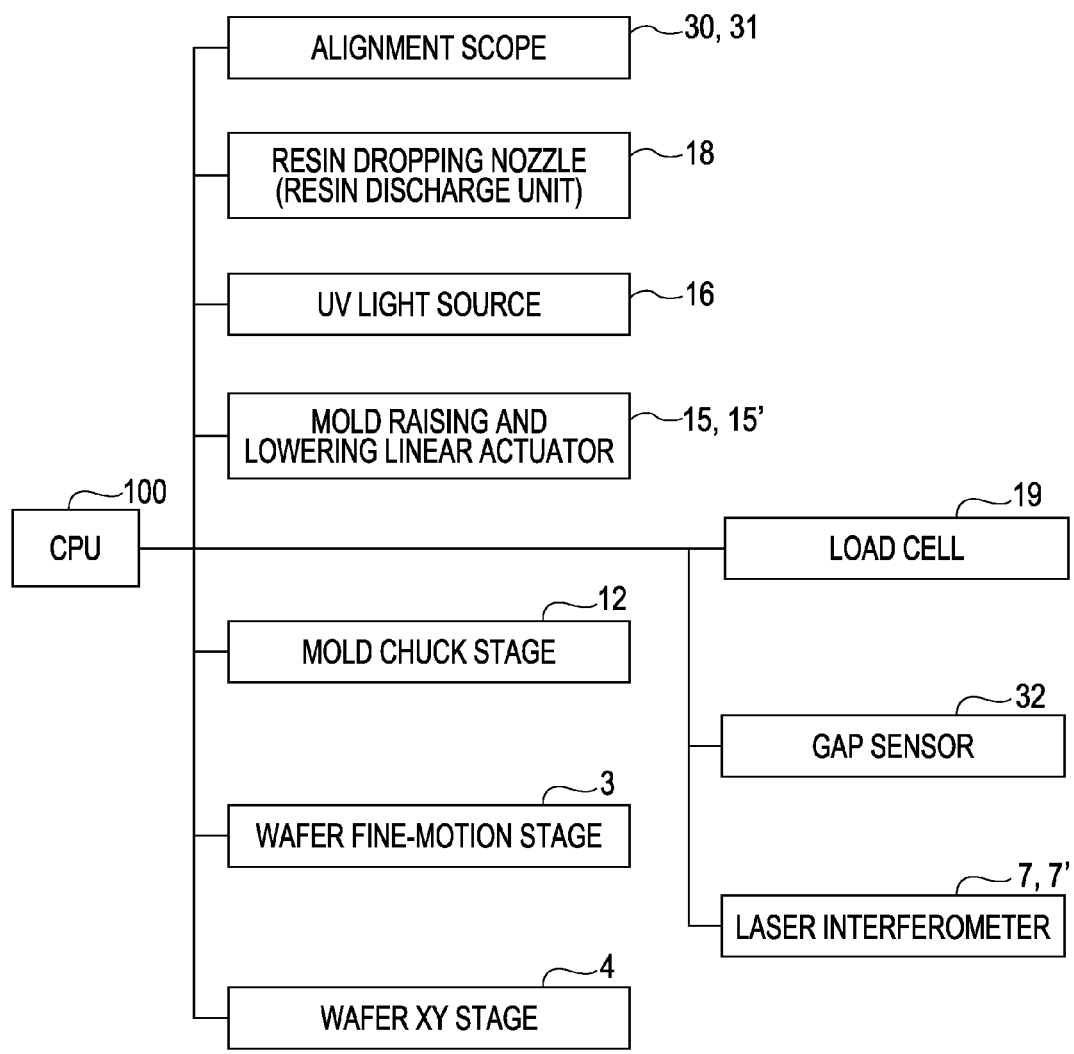
FIG. 2 is a control block diagram of an imprint apparatus.
Figure 13:
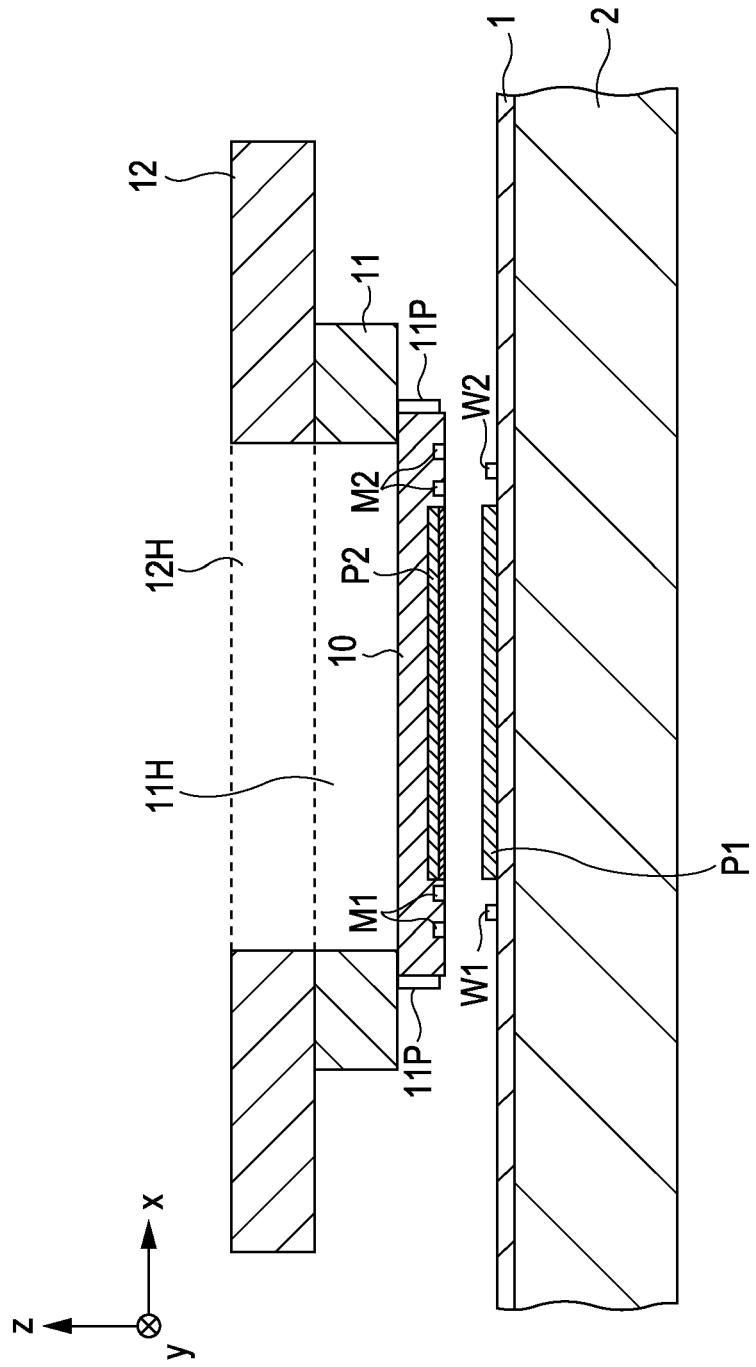
FIG. 13 is a sectional view of a mold chuck and its surroundings showing the arrangement of alignment marks.

An imprint apparatus using a light cure method of an embodiment of the present invention will now be described with reference to the drawings. FIG. 1 shows the configuration of an imprint apparatus according to an embodiment of the present invention. FIG. 2 is a control block diagram of an imprint apparatus according to an embodiment of the present invention. FIG. 13 is a sectional view of a mold chuck 11 and its surroundings showing the arrangement of alignment marks according to an embodiment of the present invention.

The imprint apparatus according to this embodiment is an apparatus that presses a mold against liquid resin disposed on a wafer 1 serving as a substrate and forms a projection-depression pattern of resin in each shot on the wafer 1. In FIGS. 1, 2, and 13, a wafer chuck 2 is an attraction unit for holding the wafer 1. A fine-motion stage 3 is a stage that has a function to correct the position of the wafer 1 in the θ-direction (the direction of rotation around the z-axis), a function to adjust the z-position of the wafer 1, and a tilt function for correcting the inclination of the wafer 1. The fine-motion stage 3 is disposed on an XY stage 4 for positioning the wafer 1 at a predetermined position. Hereinafter, the fine-motion stage 3 and the XY stage 4 will be collectively referred to as a wafer stage 3, 4. The wafer stage 3, 4 is a substrate stage that holds the wafer 1 and moves in the X-Y plane.

The XY stage 4 is placed on a base 5. Reference mirrors 6 are attached on the fine-motion stage 3 in the x- and y-directions (the mirror in the y-direction is not shown) and reflect light from a laser interferometer 7 in order to measure the position of the fine-motion stage 3. Supports 8 and 8' are pillars that are provided on the base 5 and support a top plate 9. A mold 10 has a projection-depression pattern P2 formed on the surface thereof. The pattern P2 is transferred to the wafer 1. The mold 10 is fixed to a mold chuck 11 by a mechanical holder (not shown). The mold chuck 11 is placed on a mold chuck stage 12 by a mechanical holder (not shown). Hereinafter, the mold chuck 11 and the mold chuck stage 12 will be collectively referred to as a mold stage 11, 12.

A plurality of positioning pins 11P are pins that define the position of the mold 10 on the mold chuck 11 when the mold 10 is placed on the mold chuck 11. The mold chuck stage 12 has a function to correct the position of the mold (the mold chuck 11) in the θ-direction (the direction of rotation around the z-axis) and a tilt function for correcting the inclination of the mold 10. The mold chuck stage 12 has reflecting surfaces that reflect light from a laser interferometer 7' so that the position of the mold chuck stage 12 in the x- and y-directions can be measured (the reflecting surface in the y-direction is not shown). The mold chuck 11 and the mold chuck stage 12 have openings 11H and 12H, respectively. UV light emitted from a UV light source 16 passes through a collimator lens 17, the openings 12H and 11H, and the mold 10.

Guide bars 14 and 14' pass through the top plate 9. The Guide bars 14 and 14' are fixed to the mold chuck stage 12 at one end and are fixed to a guide bar plate 13 at the other end. Mold raising and lowering linear actuators 15 and 15' are air cylinders or linear motors, and drive the guide bars 14 and 14' in the z-direction of FIG. 1 so that the mold 10 held by the mold chuck 11 is pressed against and removed from the wafer 1. That is to say, a drive mechanism that changes the distance between the mold stage 11, 12 and the wafer stage 3, 4 in the Z-axis direction includes the linear actuators 15 and 15' and the fine-motion stage 3. The linear actuators 15 and 15' change the position of the mold chuck 11 in the z-direction. The fine-motion stage 3 changes the position of the wafer chuck 2 in the z-direction. A resin dropping nozzle 18 is a nozzle that discharges liquid resin. The resin dropping nozzle 18 discharges and drops liquid light-curing resin onto the surface of the wafer 1. The UV light source 16 is a curing unit that cures liquid resin by exposing.

A plurality of load cells 19 shown in FIG. 2 are attached to the mold chuck 11 or the mold chuck stage 12 and measure the pressing force of the mold 10. Alignment scopes 30 and 31 serving as scopes output a signal for measuring the positions of marks formed on the wafer 1. That is to say, the alignment scopes 30 and 31 are measuring units that each have an optical system and a detection system (including a photoelectric conversion element or an image pickup element) for measuring the relative positional relationship between an alignment mark formed on the wafer 1 and an alignment mark provided on the mold 10. The alignment scopes 30 and 31 measure the amount of misalignment between the wafer 1 and the mold 10 in the x- and y-directions. A gap sensor 32 is, for example, a capacitance sensor and measures the height (flatness) of the wafer 1 on the wafer chuck 2.

A CPU (central control unit) 100 is a control unit that controls the above actuators and sensors and causes the apparatus to perform predetermined operations. In this embodiment, the CPU 100 causes the mold stage 11, 12 and the wafer stage 3, 4 to vibrate relative to each other so that a shot in which liquid resin is disposed vibrates in the X-Y plane with respect to a position where the shot aligns with the mold 10 held by the mold stage 11, 12. In parallel with the above vibration, the CPU 100 controls the drive mechanism and presses the mold 10 against the liquid resin. This relative vibration is a vibration of the wafer stage 3, 4 or the mold stage 11, 12.

The CPU 100 controls the position of the wafer stage 3, 4 in the X-Y plane and the operation of the alignment scopes 30 and 31, thereby measures the positions of alignment marks corresponding to a plurality of sample shots on the wafer 1, and calculates the position where each shot on the wafer stage 3, 4 serving as a substrate stage aligns with the mold 10 held by the mold stage 11, 12. According to the position of a shot obtained by the above calculation, the CPU 100 controls the position of the wafer stage 3, 4 and the discharge from the resin dropping nozzle 18 to dispose liquid resin on the shot. The CPU 100 stops the above vibration with the mold 10 pressed against the liquid resin to position the mold stage 11, 12 and the wafer stage 3, 4 relative to each other so that the shot is disposed at the above aligning position. The CPU 100 causes the UV light source 16 to operate, with the mold stage 11, 12 and the wafer stage 3, 4 positioned relative to each other, to cure the liquid resin.

The CPU 100 starts the vibration of the wafer stage 3, 4 from a position displaced from the aligning position by the amplitude of the vibration in the direction of the vibration and a direction toward a position where liquid resin has been disposed. The CPU 100 reduces at least one of the amplitude and frequency of vibration according to the decrease in the distance between the mold 10 and the shot by the linear actuators 15 and 15' and the fine-motion stage 3, and stops the vibration on the basis of the distance reduced by the linear actuators 15 and 15' and the fine-motion stage 3. The CPU 100 reduces at least one of the amplitude and frequency of the vibration according to the increase in the pressing force measured by the load cells 19, and stops the vibration on the basis of the pressing force measured by the load cells 19.

Figure 11:
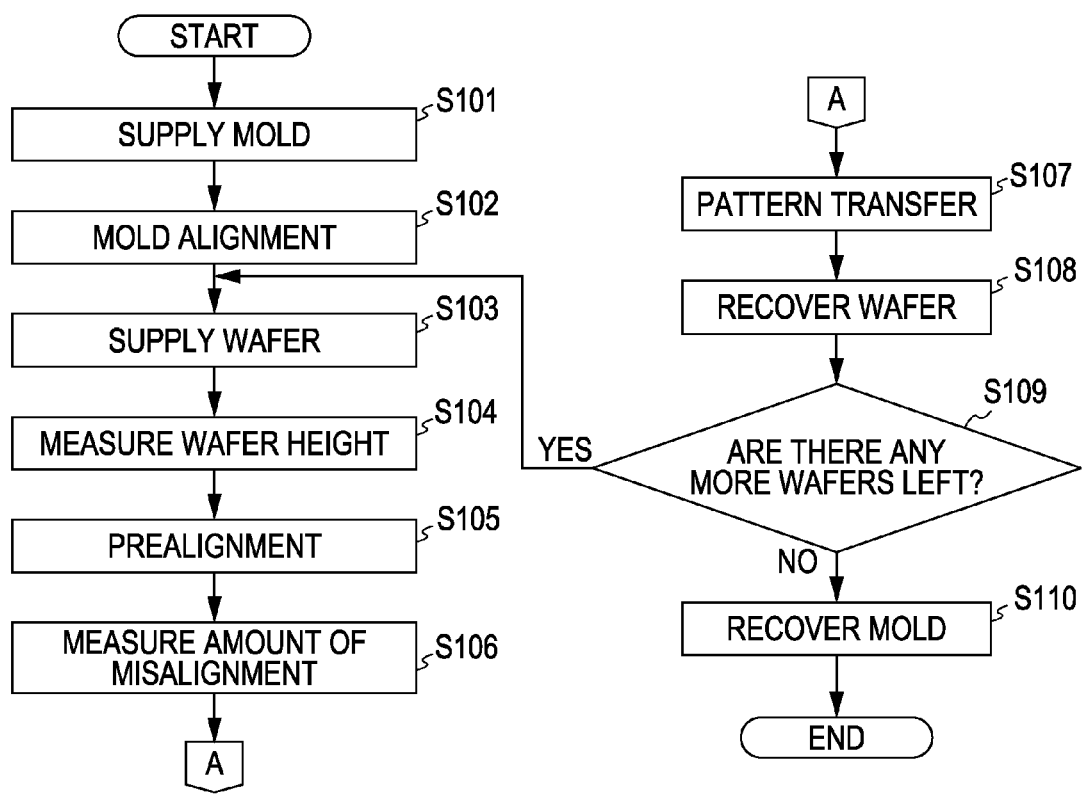
FIG. 11 is a flowchart showing an operation for a plurality of wafers in the same layer.
Figure 12:
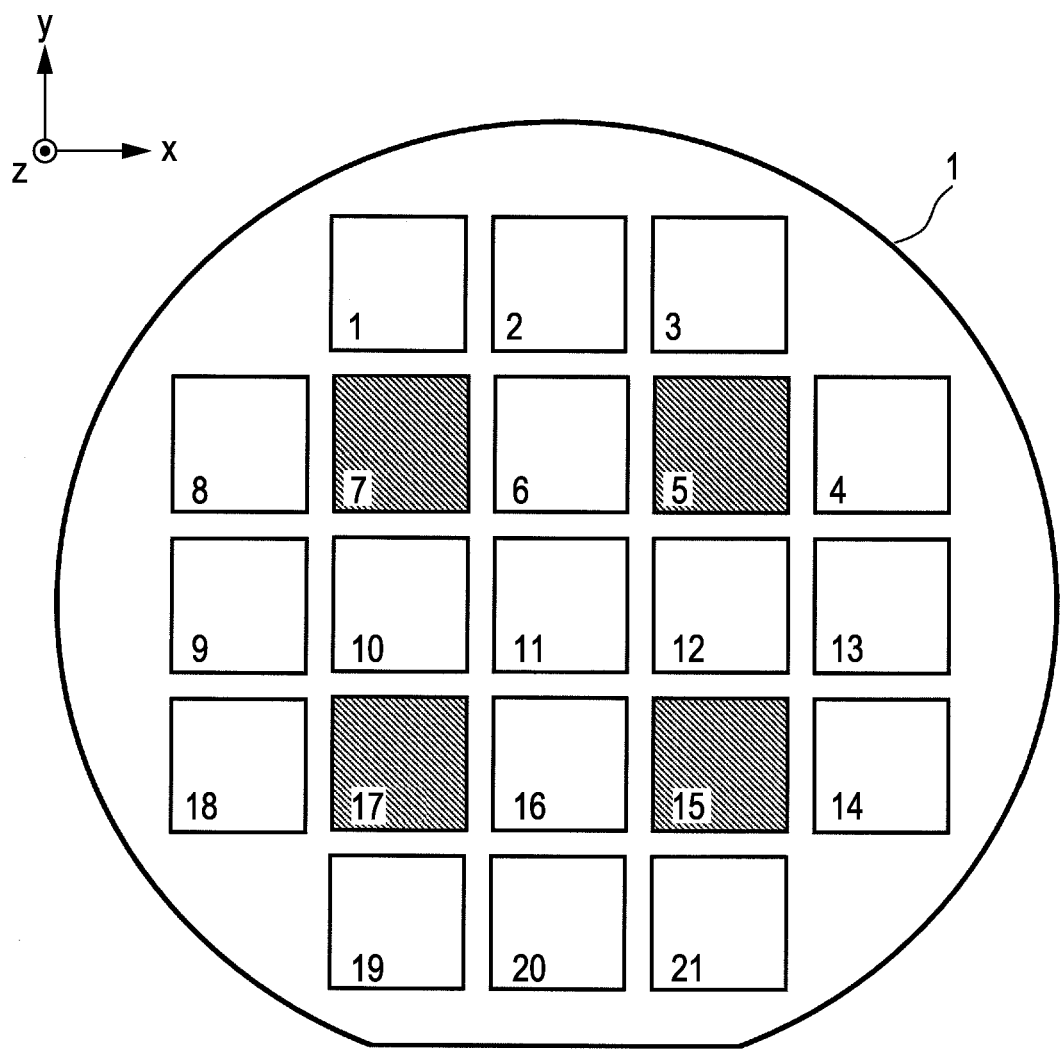
FIG. 12 shows an arrangement of sample measurement shots in global alignment.

Next, with reference to FIGS. 1 and 11 to 15, a description will be given of the movement of the pattern transfer apparatus during the making of semiconductor devices. FIG. 11 is a flowchart in the case where a pattern of a layer is transferred to a plurality of wafers using the same mold. In FIG. 11, in step S101, a mold 10 is supplied to the mold chuck 11 by a mold conveying unit (not shown). In step S102, the alignment marks M1 and M2 of the mold 10 shown in FIG. 13 and a reference mark (not shown) on the XY stage 4 are observed at the same time by the alignment scopes 30 and 31, and the position of the mold 10 in the θ-direction (the direction of rotation around the z-axis) is mainly adjusted by the mold chuck stage 12.

Next, in step S103, a wafer 1 is supplied to the wafer chuck 2 by a wafer conveying unit (not shown). In step S104, the XY stage 4 is driven, and the height (flatness) of the whole surface of the wafer 1 is measured by the gap sensor 32. As described below, this measurement data is used when the transfer shot surface of the wafer 1 is aligned with the reference plane (not shown) of the apparatus during the mold imprinting.

Next, in step S105, a prealignment mark (not shown) preliminarily transferred onto the wafer 1 is observed by a TV alignment measurement unit (not shown), and the amount of displacement of the wafer 1 relative to the apparatus in the x- and y-directions is measured. On the basis of the measurement, the position in the θ-direction (the direction of rotation around the z-axis) is corrected. In step S106, using the alignment scopes 30 and 31, in the shots 5, 7, 15, and 17 (sample measurement shots) shaded in FIG. 12, the alignment marks M1 and M2 on the mold 10 and the alignment marks W1 and W2 on the wafer 1 shown in FIG. 13 are observed at the same time, and the amount of relative displacement in the x- and y-directions is measured.

Figure 14:
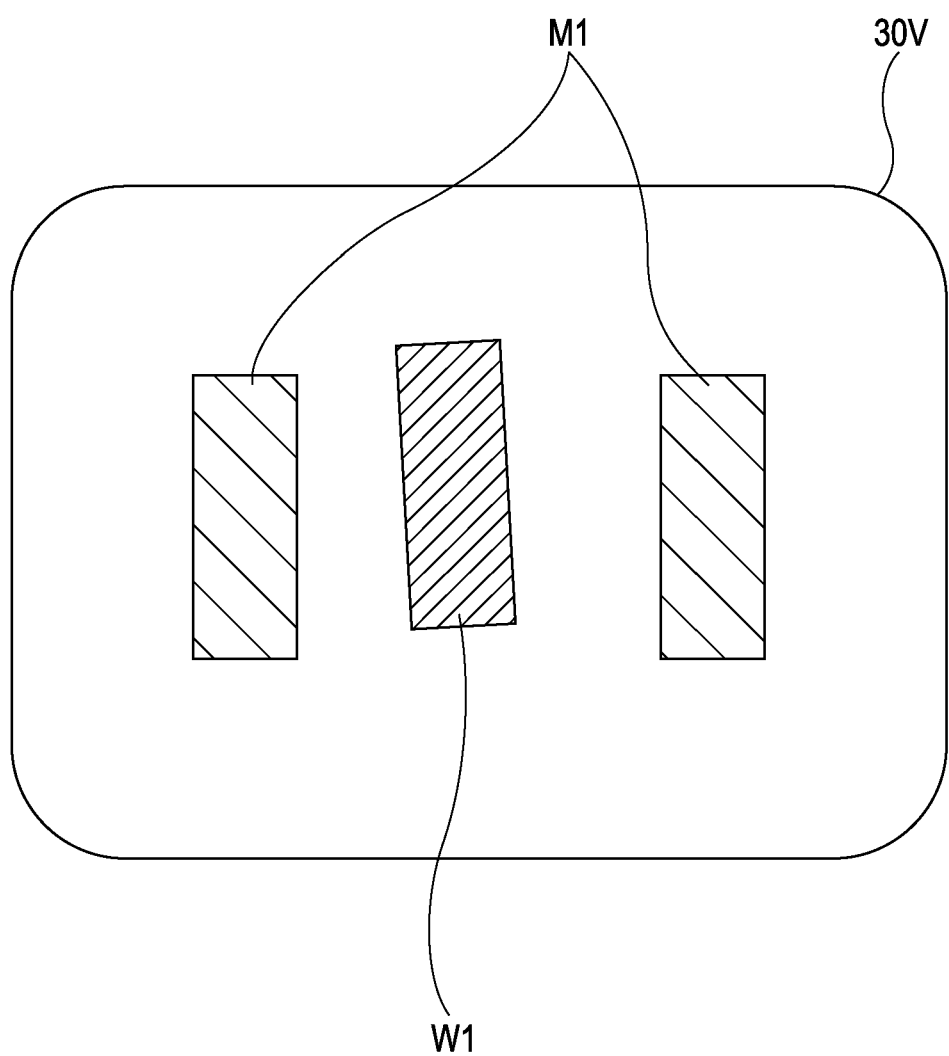
FIG. 14 shows the positional relationship between alignment marks in the field of view of an alignment scope.

In FIG. 13, P1 denotes a pattern transferred together with the alignment marks W1 and W2 in the previous layer, and P2 denotes a transfer pattern of the mold 10. FIG. 14 shows an example of each alignment mark observed by the alignment scopes 30 and 31. In FIG. 14, 30V denotes a field of view of the alignment scope 30. In this case, only the displacement in the x-direction can be measured. The displacement in the y-direction is measured using alignment marks disposed around the patterns P1 and P2 in the y-direction in the same manner.

Alignment scopes (not shown) for observing the displacement in the y-direction are disposed at corresponding positions. From the displacement in the x- and y-directions, the displacement in the θ-direction (the direction of rotation around the z-axis) is also calculated. From the measurement by the alignment scopes in the sample measurement shots in FIG. 12, the amounts of displacement in the x-, y-, and θ-directions in each shot on the wafer 1 are predicted, and the alignment target position of the wafer stage 3, 4 when transfer to each shot is performed is determined. This is the same as the method of global alignment measurement used in a step-and-repeat semiconductor projection exposure apparatus.

Figure 15:
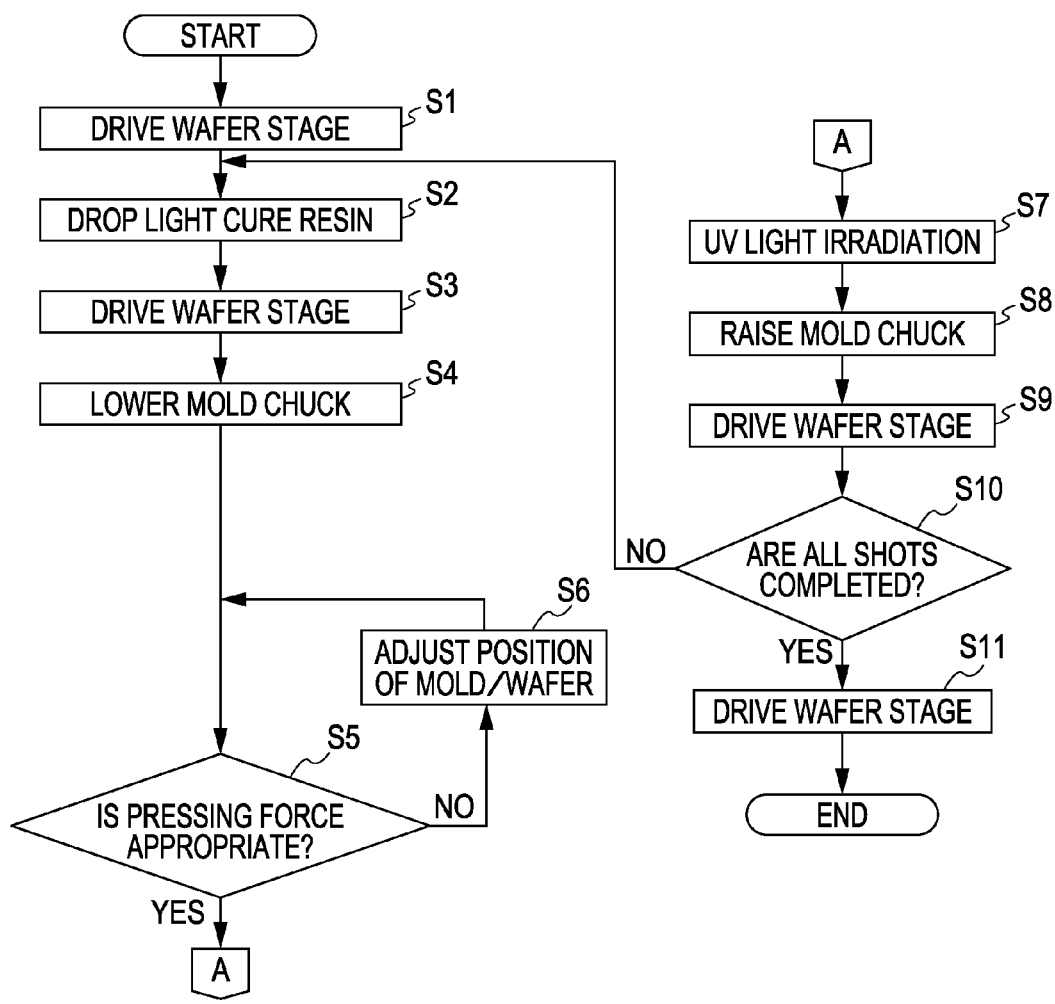
FIG. 15 is a flowchart in a conventional imprint apparatus.

Next, in step S107, pattern transfer is performed to each shot on the wafer 1 according to the flowchart shown in FIG. 15. After the pattern has been transferred to all shots, the wafer 1 is recovered from the wafer chuck 2 by a wafer conveying unit (not shown) in step S108. In step S109, it is determined whether or not there are any more wafers left to be processed. If there are any more wafers left to be processed (YES in step S109), step S103 is returned to. If there are not any more wafers left to be processed (NO in step S109), step S110 is proceeded to. In step S110, the mold 10 is recovered from the mold chuck 11 by a mold conveying unit (not shown), and pattern transfer to the plurality of wafers 1 is completed.

Figure 4:
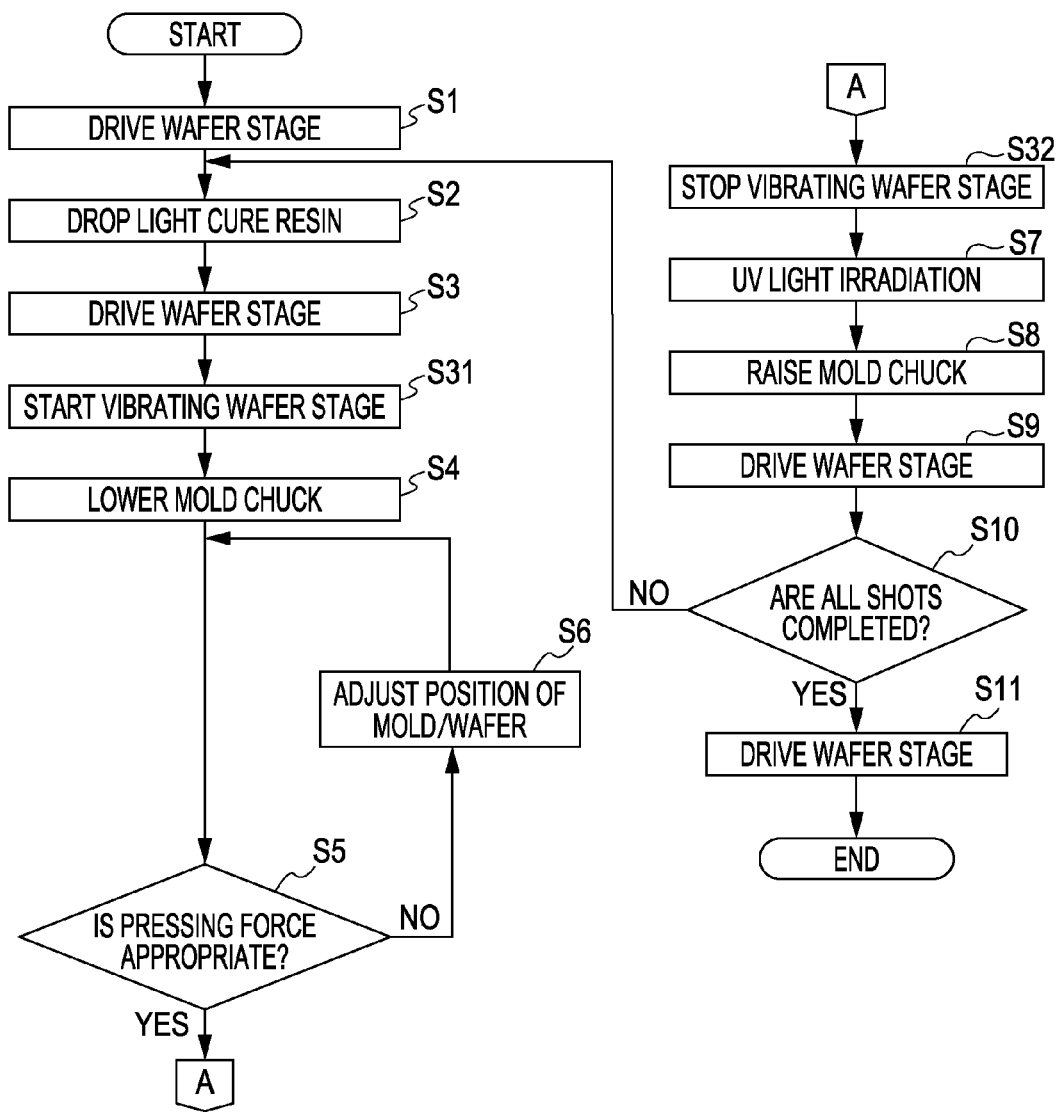
FIG. 4 is a flowchart according to a first embodiment.

FIG. 4 is a flowchart of pattern transfer to a wafer 1 in a first embodiment of the present invention and corresponds to step S107 of FIG. 11. This flowchart differs from the conventional flowchart of FIG. 15 in that steps (S31 and S32) are added in which the vibrating of the wafer stage 3, 4 (the fine-motion stage 3 and the XY stage 4) is started and stopped.

With reference to FIGS. 1, 2, and 4, a description will be given of the operation of an imprint apparatus according to a first embodiment of the present invention. Reference is made to FIG. 4. First, in step S1, the XY stage 4 is driven and the wafer chuck 2 on which a wafer 1 is placed is moved so that a place (shot) on the wafer 1 to which a pattern is transferred is located under the resin dropping nozzle 18. In step S2, light cure resin is dropped onto the target shot on the wafer 1 by the resin dropping nozzle 18.

Next, in step S3, the XY stage 4 is driven so that the plane of the shot is located opposite the pattern P2 of the mold 10. At this time, the XY stage 4 is moved to the alignment target position determined and corrected on the basis of the result of alignment measurement of step S106 of FIG. 11. At the same time, the fine-motion stage 3 is driven to adjust the height in the z-direction and inclination of the wafer chuck 2. On the basis of the above-described wafer height measurement data, the surface of the shot of the wafer 1 is aligned with the reference plane (not shown) of the apparatus. Next, in step S31, vibration is started with a predetermined amplitude and at a predetermined frequency with respect to the x- or y-axis of the fine-motion stage 3. In step S4, the linear actuators 15 and 15' are driven, and thereby the mold chuck 11 is lowered to a predetermined position.

Figure 3:
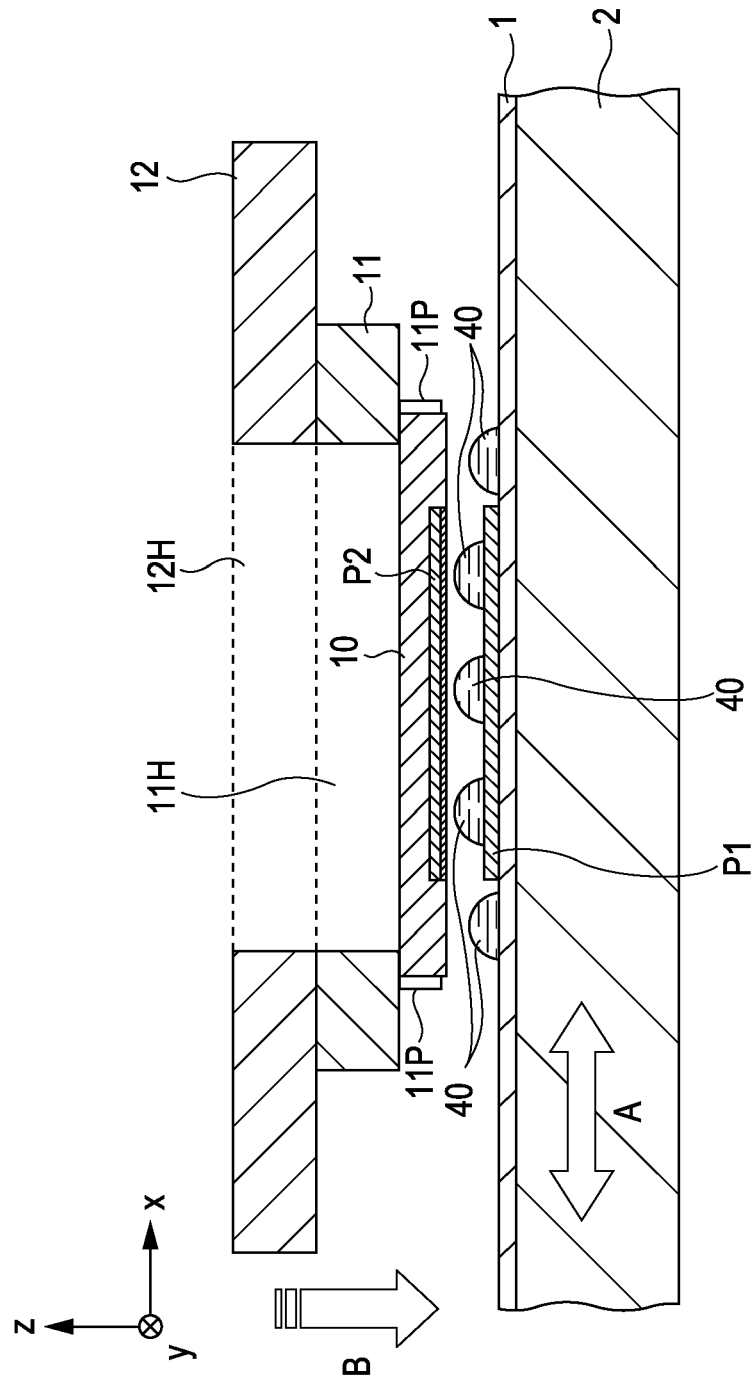
FIG. 3 is a sectional view of a mold chuck and its surroundings during imprinting.

FIG. 3 shows a sectional view of the mold chuck and its surroundings at this time. By vibrating the wafer stage, the wafer chuck 2 (wafer 1) is vibrated in the x-direction as shown by arrow A. By lowering the mold chuck stage 12 (mold 10) in the direction of arrow B, the discharged and dotted light cure resin 40 is uniformly spread between the pattern P2 of the mold 10 and the pattern P1 on the wafer 1 transferred in the previous layer. Next, in step S5, it is determined whether or not the pressing force of the mold 10 is appropriate from the output of the plurality of load cells 19 attached to the mold chuck 11 or the mold chuck stage 12. If the pressing force is not within a predetermined range (NO in step S5), step S6 is proceeded to.

In step S6, the pressing force of the mold 10 is adjusted by changing the position of the mold chuck 11 in the z-direction using the linear actuators 15 and 15' or changing the position of the wafer chuck 2 in the z-direction using the fine-motion stage 3. Until a predetermined pressing force is reached, the loop of steps S5 and S6 is repeated. When it is determined that the pressing force of the mold 10 is appropriate (YES in step S5), step S32 is proceeded to. In step S32, the vibration of the fine-motion stage 3 started in step S31 is stopped, and the fine-motion stage 3 is positioned at the alignment target position using the laser interferometer 7.

Figure 5:
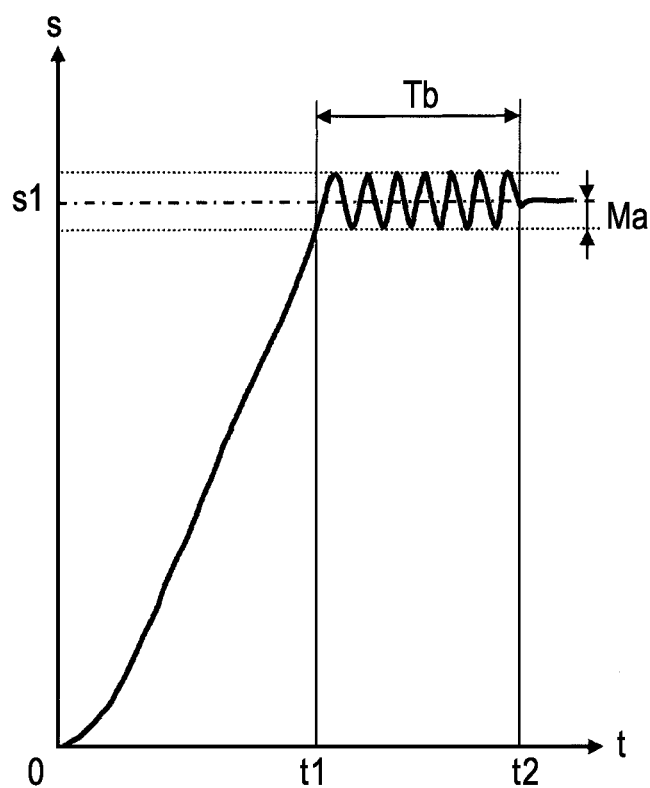
FIG. 5 is a time transition diagram showing a movement of a wafer stage according to the first embodiment.

FIG. 5 shows a movement of the wafer stage 3, 4 from step S3 to step S32. The horizontal axis t shows time that has elapsed since dropping of light cure resin. The vertical axis s shows the travel distance of the wafer stage. Reference letter s1 shows the alignment target position of the transfer shot. FIG. 5 shows that the wafer stage starts fine vibration at time t1 and at a position before s1 by a vibration amplitude Ma. Performing fine vibration using only the fine-motion stage 3 is effective because vibration at a high frequency is possible. At time t2, the pressing of the mold 10 is completed, the vibration is stopped, and the wafer stage is positioned at the alignment target position s1. The length of time Tb the wafer stage 3, 4 is finely vibrated may be shorter than the length of time until the pressing is completed. One or both of the x-axis and the y-axis may be finely vibrated.

Figure 6:
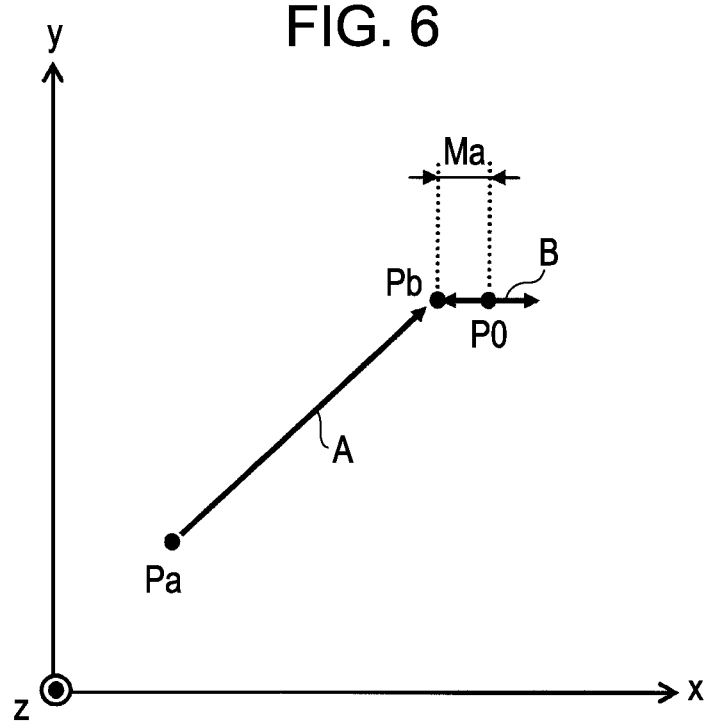
FIG. 6 shows a locus of the wafer stage according to the first embodiment.

FIG. 6 shows an example of movement of the wafer stage 3, 4 in the xy plane in the case where only the x-axis is vibrated. In FIG. 6, when moving from a position Pa to the alignment target position P0, the wafer stage moves to a position Pb displaced from the position P0 in the x-axis direction by −Ma as shown by arrow A, and then starts vibrating with an amplitude Ma as shown by arrow B. In the case where both axes are finely vibrated, the amplitude and frequency of vibration of the x-axis need not be the same as those of the y-axis. The wafer stage may be vibrated so that the wafer 1 rotates in the xy plane around the alignment target position. The axis to vibrate is selected according to the pattern of the mold. In the case of a line and space pattern extending in the x-direction, resin can be spread more effectively by vibrating only in the x-direction. Considering interference to adjacent shots, the amplitude of fine vibration is desirably not more than the width of scribe lines between shots.

Next, in step S7, UV light irradiation is performed for a predetermined time using the UV light source 16. After the UV light irradiation is complete, in step S8, the linear actuators 15 and 15' are driven to raise the mold chuck 11, and the mold 10 is removed from the cured resin on the wafer 1. Next, in step S9, the XY stage 4 is driven, and the wafer 1 is moved so that the next shot is located under the resin dropping nozzle 18.

In step S10, it is determined whether or not all shots on the wafer 1 have been imprinted with the pattern. If there are any unimprinted shots left (NO in step S10), step S2 is returned to. If there are not any unimprinted shots left (YES in step S10), step S11 is proceeded to. In step S11, the XY stage 4 is driven to a predetermined position in preparation for the recovery of the wafer 1 (step S108 of FIG. 11).

As described above, the mold 10 is pressed while the wafer 1 is finely vibrated relative to the mold 10 with respect to an alignment position determined by measuring in advance. Therefore, light cure resin is easily spread when the mold 10 is imprinted, and the imprinting time is reduced. In addition, as soon as the fine vibration is stopped, return to the alignment position can be performed. Therefore, no realignment is needed, and high throughput transfer can be performed even in the pattern transfer that needs superposition.

Figure 7:
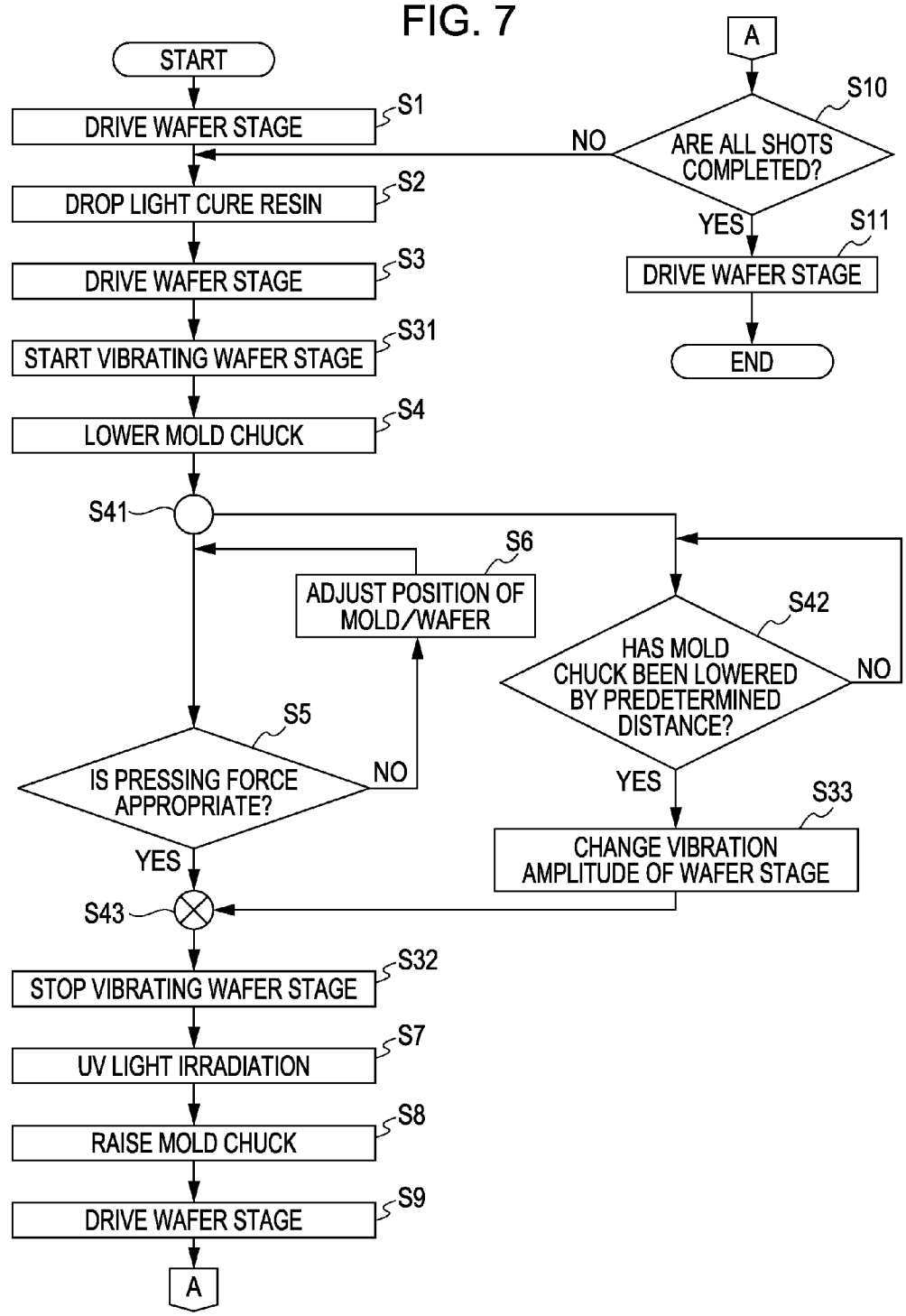
FIG. 7 is a flowchart according to a second embodiment.

Next, with reference to FIGS. 7 and 8, a description will be given of the operation of a pattern transfer apparatus according to a second embodiment of the present invention. FIG. 7 is a flowchart of pattern transfer to a wafer 1. This flowchart differs from the flowchart of FIG. 4 in that a step is added in which the vibration amplitude of the wafer stage is changed when the amount of pressing (the amount of lowering) of the mold 10 reaches a predetermined value. In FIG. 7, steps S1 to S4 (lowering of the mold chuck) are the same as those of FIG. 4.

The flow branches at step S41. In one of the branches, the determination whether or not the pressing force is appropriate (step S5) and the adjustment therefor (step S6) are the same as those of FIG. 4. In the other branch, in step S42, determination is repeated until the amount of lowering of the mold chuck 11 (the amount of pressing of the mold 10) reaches a predetermined value. When the amount of pressing of the mold 10 reaches the predetermined value (YES in step S42), step S33 is proceeded to, and the vibration amplitude of the wafer stage is changed to a smaller amplitude. The branched flows merge together at step S43. The subsequent steps are the same as those of FIG. 4.

Figure 8:
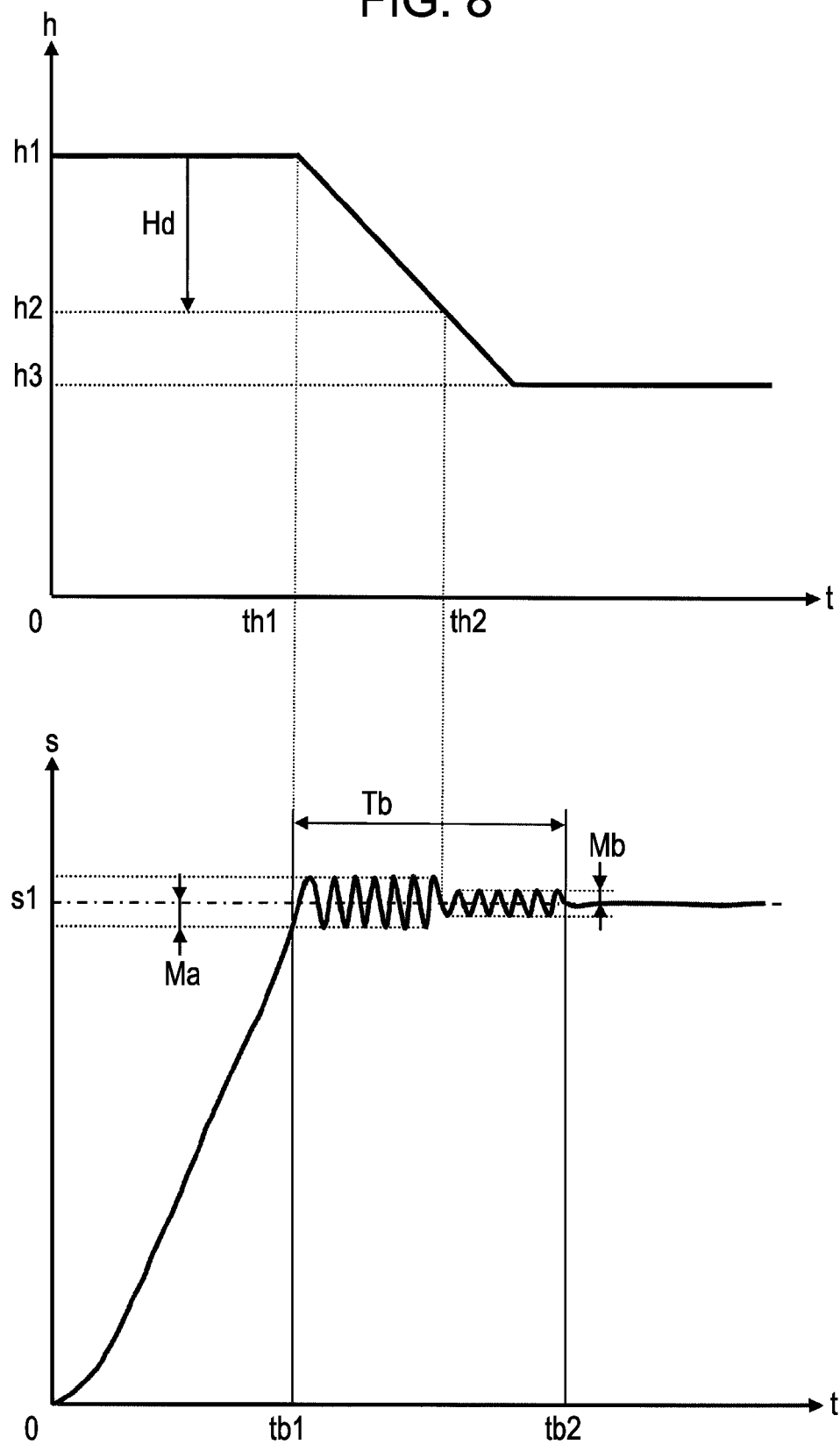
FIG. 8 is a transition diagram showing movements of a mold and a wafer stage according to the second embodiment.

FIG. 8 shows a change of mold position h with respect to time t, and a change of travel distance s of the wafer stage 3, 4 with respect to time t. In FIG. 8, the mold starts lowering from a position h1 at a time point tb1 (th1) when the wafer stage 3, 4 starts fine vibration a distance Ma before the alignment target position s1. At a time point th2 when the mold has lowered to a position h2 by a distance Hd, the amplitude of the fine vibration of the wafer stage 3, 4 is reduced from Ma to Mb, by about half. At the same time, the frequency of the fine vibration may be changed to a lower value. As described above, the amplitude or frequency of the fine vibration of the wafer stage 3, 4 is changed according to the amount of pressing of the mold 10 (for example, the amplitude and frequency of the fine vibration are reduced as the amount of pressing of the mold 10 increases). Therefore, the fine vibration does not overload the wafer stage 3, 4, and light cure resin can be effectively spread.

Figure 9:
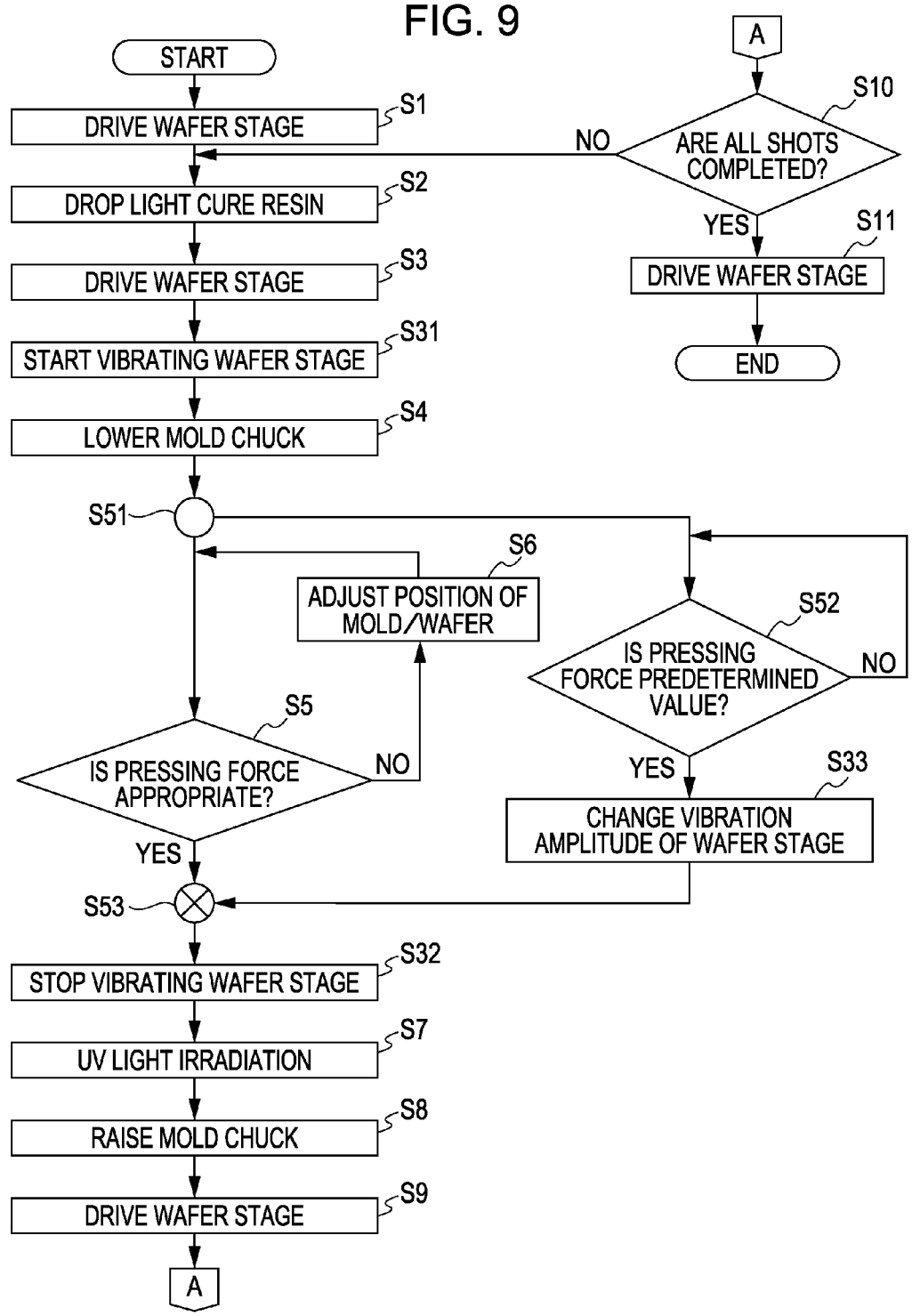
FIG. 9 is a flowchart according to a third embodiment.

Next, with reference to FIGS. 9 and 10, a description will be given of the operation of a pattern transfer apparatus according to a third embodiment of the present invention. FIG. 7 is a flowchart of pattern transfer to a wafer 1. This flowchart differs from the flowchart of FIG. 4 in that a step is added in which the vibration amplitude of the wafer stage is changed when the pressing force of the mold 10 reaches a predetermined value. In FIG. 9, steps S1 to S4 (lowering of the mold chuck) are the same as those of FIG. 4.

The flow branches at step S51. In one of the branches, the determination whether or not the pressing force is appropriate (step S5) and the adjustment therefor (step S6) are the same as those of FIG. 4. In the other branch, in step S52, determination is repeated until the pressing force of the mold 10 measured by the plurality of load cells 19 reaches a predetermined value. When the pressing force of the mold 10 reaches the predetermined value (YES in step S52), step S33 is proceeded to, and the vibration amplitude of the wafer stage is changed to a smaller amplitude. The branched flows merge together at step S53. The subsequent steps are the same as those of FIG. 4.

Figure 10:
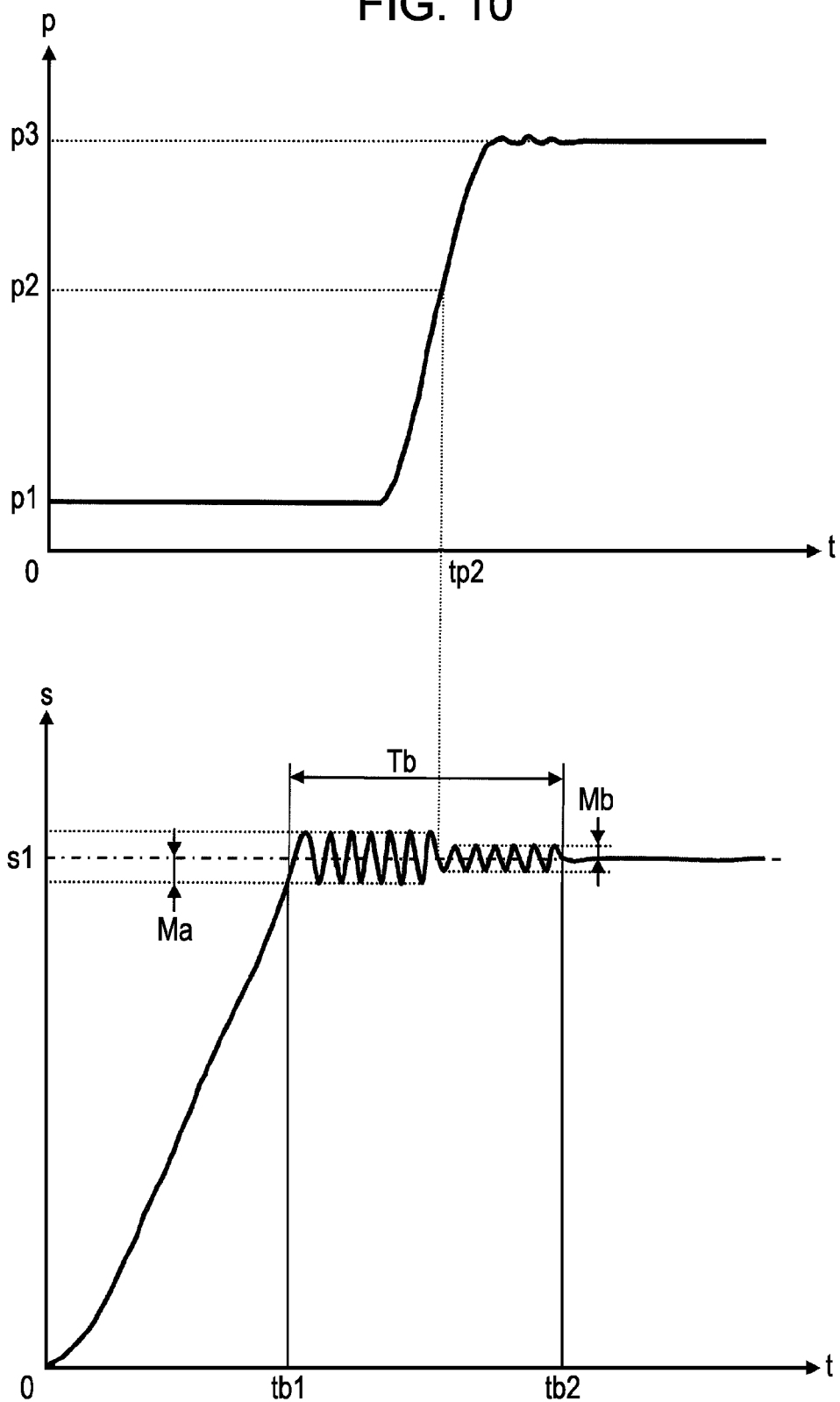
FIG. 10 is a transition diagram showing a change in the pressing force of a mold and movements of a mold and a wafer stage according to the second embodiment.

FIG. 10 shows a change of mold pressing force p with respect to time t, and a change of travel distance s of the wafer stage 3, 4 with respect to time t. In FIG. 10, the mold starts lowering at a time point tb1 when the wafer stage starts fine vibration a distance Ma before the alignment target position s1. At a time point tb2 when the mold has lowered to a predetermined position, and when the pressing force p has increased from p1 at the start of lowering to p2, the amplitude of the fine vibration of the wafer stage is reduced from Ma to Mb, by about half. At the same time, the frequency of the fine vibration may be changed to a lower value. As described above, the amplitude or frequency of the fine vibration of the wafer stage is changed according to the pressing force of the mold (for example, the amplitude and frequency of the fine vibration are reduced as the pressing force of the mold increases). Therefore, the fine vibration does not overload the wafer stage and light cure resin can be effectively spread.

As described above, the imprint apparatus according to any one of the embodiments of the present invention is a pattern transfer apparatus that presses a mold on which a projection-depression pattern is formed against resin on a substrate while vibrating the mold relative to the substrate in a direction parallel to the projection-depression pattern surface. After the resin is cured, the mold is removed from the resin. The projection-depression pattern is sequentially transferred to each shot on the substrate.

In this imprint apparatus, before imprinting, the substrate and the mold are relatively moved to a position displaced by a predetermined distance from an alignment target position for each shot. The alignment target position is determined on the basis of the amount of relative displacement measured in advance between the projection-depression pattern of the mold and certain shots on the substrate. During imprinting, the substrate and the mold are relatively vibrated with respect to the alignment target position with an amplitude corresponding to the predetermined distance.

Before curing the resin, the vibration of the substrate stage is stopped, and the substrate stage is positioned at the alignment target position. The amplitude of vibration of the substrate stage is changed according to the amount of pressing of the mold relative to the resin on the substrate or the pressing force of the mold relative to the resin on the substrate. This quickens the spread of resin on the substrate during imprinting. Therefore, a high-throughput imprint apparatus serving as a pattern transfer apparatus can be provided.

In addition, an imprint apparatus serving as a pattern transfer apparatus can be provided that can perform high-speed imprinting and high-speed positioning while keeping superposition accuracy in each shot. The imprint apparatus can be used as a fine pattern transfer apparatus that produces semiconductors and MEMS (Micro Electro-Mechanical Systems). In the above description, the relative vibration between the mold and the substrate during mold imprinting is performed by vibrating the substrate stage. However, it is clear that vibrating the mold can achieve the same effect.

Embodiment of Method of Manufacturing Article

A method of manufacturing a device as an article (for example, a semiconductor integrated circuit device or a liquid crystal display device) can include a step of transferring (forming) a pattern to (on) a substrate (for example, a wafer, a glass plate, or a film substrate) using an imprint apparatus according to any one of the above-described embodiments, and a step of etching the substrate to which the pattern is transferred. When manufacturing other articles such as patterned media (recording media) and optical devices, the method can include, instead of the etching step, a step of processing the substrate to which the pattern is transferred.

The article manufacturing method of this embodiment has an advantage, as compared with a conventional article manufacturing method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-241840 filed Sep. 19, 2008, which is hereby incorporated by reference herein in its entirety.

What is claimed is:

1. An imprint apparatus that molds resin dispensed on a shot region of a substrate with a mold and forms a pattern of resin on the shot region, the apparatus comprising:
   a mold stage configured to hold the mold;
   a substrate stage configured to hold the substrate;
   a drive mechanism configured to change a relative positional relationship between the mold stage and the substrate stage in an X-Y plane that defines a coordinate of the shot region and a Z-axis direction perpendicular to the X-Y plane;
   a scope configured to output a signal for measuring a position of a mark formed on the substrate;
   a nozzle configured to discharge the resin; and
   a curing device configured to cure the resin, and
   a processor,
   wherein the processor is configured to control a position of the substrate stage in the X-Y plane and an operation of the scope to obtain the signal with respect to a mark corresponding to each of a plurality of sample shot regions on the substrate, to calculate a position of the substrate stage where each shot region on the substrate aligns with the mold held by the mold stage based on the obtained signals, to control a position of the substrate stage and discharge from the nozzle to dispense the resin on a shot region based on the calculated position, to control the drive mechanism so that vibration of the substrate stage is performed in the X-Y plane with respect to the calculated position, the vibration of the substrate stage is started at a position displaced from the calculated position, in a direction of the vibration and in a direction toward a position of the substrate stage where the resin has been dispensed, by an amplitude of the vibration, and a distance between the mold and the shot region is decreased in the Z-axis direction in parallel with the vibration to mold the resin by the mold, to stop the vibration during the molding at the calculated position, and to cause the curing device to cure the resin on the substrate stage of which the vibration is stopped.

2. An apparatus according to claim 1, wherein the processor is configured to decrease at least one of an amplitude and a frequency of the vibration in accordance with a decrease in the distance by the drive mechanism.

3. An apparatus according to claim 1, further comprising a measurement device configured to measure a force that presses the mold and the resin to each other, wherein the processor is configured to decrease at least one of an amplitude and a frequency of the vibration in accordance with an increase in the measured force.

4. An apparatus according to claim 1, wherein the processor is configured to stop the vibration based on the distance decreased by the drive mechanism.

5. An apparatus according to claim 1, further comprising a measurement device configured to measure a force that presses the mold and the resin to each other, wherein the processor is configured to stop the vibration based on the measured force.

6. A method of manufacturing an article, the method comprising:
   forming a pattern of a resin on a shot region of a substrate using an imprint apparatus; and
   processing the substrate, on which the pattern has been formed, to manufacture the article,
   wherein the imprint apparatus molds the resin dispensed on the shot region of the substrate with a mold and forms a pattern of resin on the shot region, the apparatus including:
   a mold stage configured to hold the mold;
   a substrate stage configured to hold the substrate;
   a drive mechanism configured to change a relative positional relationship between the mold stage and the substrate stage in an X-Y plane that defines a coordinate of the shot region and a Z-axis direction perpendicular to the X-Y plane;
   a scope configured to output a signal for measuring a position of a mark formed on the substrate;
   a nozzle configured to discharge the resin;
   a curing device configured to cure the resin; and
   a processor,
   wherein the processor is configured to control a position of the substrate stage in the X-Y plane and an operation of the scope to obtain the signal with respect to a mark corresponding to each of a plurality of sample shot regions on the substrate, to calculate a position of the substrate stage where each shot region on the substrate aligns with the mold held by the mold stage based on the obtained signals, to control a position of the substrate stage and discharge from the nozzle to dispense the resin on a shot region based on the calculated position, to control the drive mechanism so that vibration of the substrate stage is performed in the X-Y plane with respect to the calculated position, the vibration of the substrate stage is started at a position displaced from the calculated position, in a direction of the vibration and in a direction toward a position of the substrate stage where the resin has been dispensed, by an amplitude of the vibration, and a distance between the mold and the shot region is decreased in the Z-axis direction in parallel with the vibration to mold the resin by the mold, to stop the vibration during the molding at the calculated position, and to cause the curing device to cure the resin on the substrate stage of which the vibration is stopped.

* * * * *